(12) United States Patent
Fan et al.

(10) Patent No.: US 10,804,148 B2
(45) Date of Patent: Oct. 13, 2020

(54) BURIED CONTACT TO PROVIDE REDUCED VFET FEATURE-TO-FEATURE TOLERANCE REQUIREMENTS

(71) Applicant: INTERNATIONAL BUSINESS MACHINES CORPORATION, Armonk, NY (US)

(72) Inventors: Su Chen Fan, Cohoes, NY (US); Jeffrey C. Shearer, Slingerlands, NY (US); Robert C. Wong, Poughkeepsie, NY (US); Ruilong Xie, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 79 days.

(21) Appl. No.: 15/686,315

(22) Filed: Aug. 25, 2017

(65) Prior Publication Data

US 2019/0067100 A1    Feb. 28, 2019

(51) Int. Cl.
*H01L 27/11* (2006.01)
*H01L 21/768* (2006.01)
(Continued)

(52) U.S. Cl.
CPC ............ *H01L 21/76897* (2013.01); *H01L 21/823821* (2013.01); *H01L 21/823828* (2013.01);
(Continued)

(58) Field of Classification Search
CPC ......... H01L 27/0886; H01L 21/823431; H01L 21/823821; H01L 27/0924; H01L 27/1211; H01L 29/41791; H01L 29/66795; H01L 29/785; H01L 27/2454; H01L 29/7827; H01L 29/78642; H01L 21/823885; H01L 21/76897; H01L 29/1087; H01L 23/535; H01L 21/823871; H01L 27/092; H01L 27/0928; H01L 21/76807; H01L 21/76877; H01L 21/845; H01L 29/0657; H01L 21/823487; H01L 27/0922; H01L 21/743; H01L 29/76897; H01L 29/42392;
(Continued)

(56) References Cited

U.S. PATENT DOCUMENTS 5,376,814 A    12/1994 Lee
5,416,736 A    5/1995 Kosa et al.
(Continued)

OTHER PUBLICATIONS

List of IBM Patents or Patent Applictions Treated as Related; (Appendix P), Filed Mar. 21, 2019, 2 pages.

*Primary Examiner* — Dung A. Le
(74) *Attorney, Agent, or Firm* — Cantor Colburn LLP; Joseph Petrokaitis

(57) ABSTRACT

Embodiments are directed to a semiconductor device. The semiconductor device includes a first semiconductor fin formed opposite a surface of a first active region of a substrate. The semiconductor device further includes a second semiconductor fin formed opposite a surface of a second active region of the substrate. The semiconductor device further includes a self-aligned buried contact formed over portions of the first active region and the second active region and between the first semiconductor fin and the second semiconductor fin.

6 Claims, 11 Drawing Sheets

(51) Int. Cl.

| | | |
|---|---|---|
| *H01L 21/8238* | (2006.01) | |
| *H01L 23/535* | (2006.01) | |
| *H01L 29/49* | (2006.01) | |
| *H01L 29/78* | (2006.01) | |
| *H01L 27/092* | (2006.01) | |
| *H01L 29/423* | (2006.01) | |
| *H01L 29/66* | (2006.01) | |
| *H01L 27/12* | (2006.01) | |
| *H01L 29/786* | (2006.01) | |

(52) U.S. Cl.
CPC ........ *H01L 21/823864* (2013.01); *H01L 21/823885* (2013.01); *H01L 23/535* (2013.01); *H01L 27/092* (2013.01); *H01L 27/0922* (2013.01); *H01L 27/0924* (2013.01); *H01L 27/0928* (2013.01); *H01L 27/1211* (2013.01); *H01L 29/42392* (2013.01); *H01L 29/4983* (2013.01); *H01L 29/66666* (2013.01); *H01L 29/66742* (2013.01); *H01L 29/7827* (2013.01); *H01L 29/78642* (2013.01); *H01L 21/823871* (2013.01); *H01L 27/1104* (2013.01)

(58) Field of Classification Search
CPC ......... H01L 29/66666; H01L 29/78615; H01L 29/4236; G11C 5/06
See application file for complete search history.

(56) References Cited

U.S. PATENT DOCUMENTS

| | | | |
|---|---|---|---|
| 5,554,870 A | 9/1996 | Fitch et al. | |
| 5,656,842 A * | 8/1997 | Iwamatsu | H01L 27/088 257/329 |
| 5,981,995 A | 11/1999 | Selcuk | |
| 6,038,164 A | 3/2000 | Schulz et al. | |
| 7,098,114 B1 * | 8/2006 | Syau | H01L 21/823425 257/E21.62 |
| 7,285,467 B2 | 10/2007 | Song | |
| 8,373,235 B2 | 2/2013 | Masuoka et al. | |
| 8,378,425 B2 | 2/2013 | Masuoka et al. | |
| 9,251,888 B1 | 2/2016 | Liaw | |
| 9,312,383 B1 * | 4/2016 | Cheng | H01L 29/7827 |
| 9,530,863 B1 * | 12/2016 | Zhang | H01L 29/66545 |
| 9,613,955 B1 * | 4/2017 | Anderson | H01L 27/0886 |
| 9,653,575 B1 * | 5/2017 | Basker | H01L 29/66666 |
| 9,825,032 B1 | 11/2017 | Bentley | |
| 9,960,272 B1 * | 5/2018 | Bao | H01L 29/7827 |
| 2003/0075758 A1 * | 4/2003 | Sundaresan | H01L 21/823885 257/329 |
| 2004/0104419 A1 * | 6/2004 | Bohr | H01L 21/76816 257/308 |
| 2007/0090428 A1 * | 4/2007 | Liaw | H01L 21/76895 257/296 |
| 2010/0059831 A1 * | 3/2010 | Lee | H01L 21/823864 257/384 |
| 2010/0207201 A1 * | 8/2010 | Masuoka | H01L 27/0207 257/329 |
| 2010/0213525 A1 * | 8/2010 | Masuoka | H01L 21/823828 257/306 |
| 2010/0219483 A1 * | 9/2010 | Masuoka | H01L 27/0207 257/369 |
| 2010/0224936 A1 * | 9/2010 | Hokazono | H01L 21/76897 257/368 |
| 2010/0314690 A1 * | 12/2010 | Chung | H01L 21/76829 257/384 |
| 2011/0073940 A1 * | 3/2011 | Lee | H01L 21/28518 257/332 |
| 2011/0156107 A1 * | 6/2011 | Bohr | H01L 21/76831 257/288 |
| 2013/0256767 A1 * | 10/2013 | Pradhan | H01L 29/6656 257/288 |
| 2015/0318213 A1 * | 11/2015 | Tsai | H01L 29/42376 257/9 |
| 2016/0056173 A1 * | 2/2016 | Masuoka | H01L 29/66666 257/203 |
| 2016/0247720 A1 * | 8/2016 | Lien | H01L 29/7827 |
| 2017/0352625 A1 * | 12/2017 | Leobandung | H01L 23/535 |

* cited by examiner

BURIED CONTACT TO PROVIDE REDUCED VFET FEATURE-TO-FEATURE TOLERANCE REQUIREMENTS

BACKGROUND

The present invention generally relates to fabrication methods and resulting structures for semiconductor devices. More specifically, the present invention relates to the formation of buried contacts in vertical field effect transistors (VFETs) of a static random-access memory (SRAM) device that reduces the VFET feature-to-feature requirements from the feature-to-feature tolerances that are required by known VFET fabrication processes.

In contemporary semiconductor device fabrication processes, a large number of semiconductor devices, such as field effect transistors (FETs), are fabricated on a single wafer. Some non-planar transistor device architectures, such as VFETs, employ semiconductor fins and side-gates that can be contacted outside the active region, resulting in increased device density and performance over lateral devices. In contemporary VFET devices, in contrast to conventional FETs, the source to drain current flows through a vertical pillar in a direction that is perpendicular with respect to a horizontal major surface of the wafer or substrate. A VFET can achieve a smaller device footprint because its channel length is decoupled from the contacted gate pitch.

VFET-based SRAM architectures provide a non-planar SRAM topology that is critical to scaling integrated circuits (ICs) beyond the 10 nm node. There are challenges, however, in integrating sub-10 nm VFET technologies into CMOS circuit components such as SRAM. For example, reducing fin pitch is one method for reducing the foot print of the SRAM transistors. Fin pitch is the centerline-to-centerline distance between corresponding elements (e.g., the fins) of adjacent transistors. However, the required feature-to-feature spacing requirements for sub-10 nm VFET-based SRAM layouts can limit the extent to which the fin pitch can be reduced using known VFET device structures.

More specifically, in VFET-based SRAM devices, a bottom source/drain (S/D) contact is formed over portions of two active regions having complementary doping types, for example, an n-type active region and a p-type active region. A conductive contact is formed to contact the bottom S/D contact and a p-type semiconductor fin gate, and current is prevented from flowing between the p-type active region and the p-type semiconductor fin by a shallow trench isolation (STI).

In conventional VFET-based SRAM devices, the bottom S/D contact is prevented from shorting to an n-type semiconductor fin gate by a dielectric region. The width of the dielectric region is relatively wide and difficult to scale due to the limitations of fabrication processes such as lithography, which are subject to overlay errors. In other words, as the width of the dielectric region scales to smaller critical dimensions, the innate overlay errors associated with the best available lithography techniques become relatively large and a short between the bottom S/D contact and the n-type semiconductor fin gate cannot be reliably prevented.

Overlay errors, or positioning errors, of a mask during the fabrication operations for forming semiconductor device features can lead to reliability issues in the final fabricated semiconductor device. Overlay errors can result from misalignment during the lithography process as the mask invariably becomes misaligned with the underlying structure. Some level of overlay error is unavoidable.

In order to reduce the impact of overlay errors, the allowable tolerances between various transistor features cannot be reduced below certain levels. For example, in order to reduce the impact of overlay errors, the current requirements for the spacing between the nFET gate and the bottom S/D contact of an SRAM VFET is not less than 32 nanometers. Accordingly, overall scaling of conventional VFET-based SRAM devices is bottlenecked by the relatively wide dielectric region between the n-type semiconductor fin gate and the bottom S/D contact.

SUMMARY

The current invention is directed to systems and methods for fabricating VFET devices in a manner that allows the distance between features of the VFET device to be reduced, thereby enabling a reduction in fin pitch. In a non-limiting example of the invention, systems and methods are provided for forming a buried trench silicide contact in a VFET to enable aggressive scaling in VFET-based SRAM devices.

Embodiments of the present invention are directed to a semiconductor device. A non-limiting example of the semiconductor device includes a first semiconductor fin formed opposite a surface of a first active region of a substrate. The semiconductor device further includes a second semiconductor fin formed opposite a surface of a second active region of the substrate. The semiconductor device further includes a self-aligned buried contact formed over portions of the first active region and the second active region and between the first semiconductor fin and the second semiconductor fin.

The self-aligned buried contact provides the technical benefit of a significant footprint reduction in VFET-based SRAM devices. Consequently, the size of an SRAM device can be made smaller.

In some embodiments, the semiconductor device further includes a spacer between the first gate and the self-aligned buried contact. The spacer provides the advantage of enabling a self-aligned contact (SAC) process for forming the self-aligned buried contact.

In some embodiments, the spacer has a thickness of about 5 nanometers to about 12 nanometers. Thus, the technical benefit of achieving increased device density requirements can be realized. For example, SRAM devices formed by conventional methods can require a contact-to-gate separation of about 32 nanometers.

Embodiments of the present invention are directed to a semiconductor device. A non-limiting example of the semiconductor device includes a substrate comprising a first active region and a second active region. The semiconductor device further includes a gate formed opposite a surface of the first active region. The semiconductor device further includes a buried contact formed over portions of the first active region and the second active region. The semiconductor device further includes a dielectric spacer formed on the first active region and between the buried contact and the gate.

The dielectric spacer provides the technical benefit of reducing the minimum required contact-to-gate spacing between the buried contact and the first gate. In this manner, a VFET-based SRAM device having a reduced contact-to-gate spacing requirement and a reduced footprint is provided.

In some embodiments, the dielectric spacer has a thickness of about 5 nanometers to about 12 nanometers. Accordingly, the dielectric spacer provides the advantage of substantially reducing the conventional VFET-based SRAM contact-to-gate spacing from about 32 nanometers to about 5 nanometers to 12 nanometers.

Embodiments of the present invention are directed to a method of forming a semiconductor device. A non-limiting example of the method includes forming a first semiconductor fin opposite a surface of a first active region of a substrate. The method further includes forming a second semiconductor fin opposite a surface of a second active region of the substrate. The method further includes forming a self-aligned buried contact over portions of the first active region and the second active region and between the first semiconductor fin and the second semiconductor fin.

Formation of the self-aligned buried contact provides the technical benefit of reducing contact-to-gate spacing requirements. In particular, formation of the self-aligned buried contact enables a reduction in contact spacing between the first gate and the self-aligned buried contact.

In some embodiments, forming the self-aligned buried contact includes forming a spacer. The spacer provide the advantage of easing contact misalignment tolerances by preventing the buried contact from electrically shorting to the first gate.

In some embodiments, the spacer has a thickness of about 5 nanometers to about 12 nanometers. Such a distance which provides the technical benefit of reducing fin pitch in VFET-based SRAM layouts.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
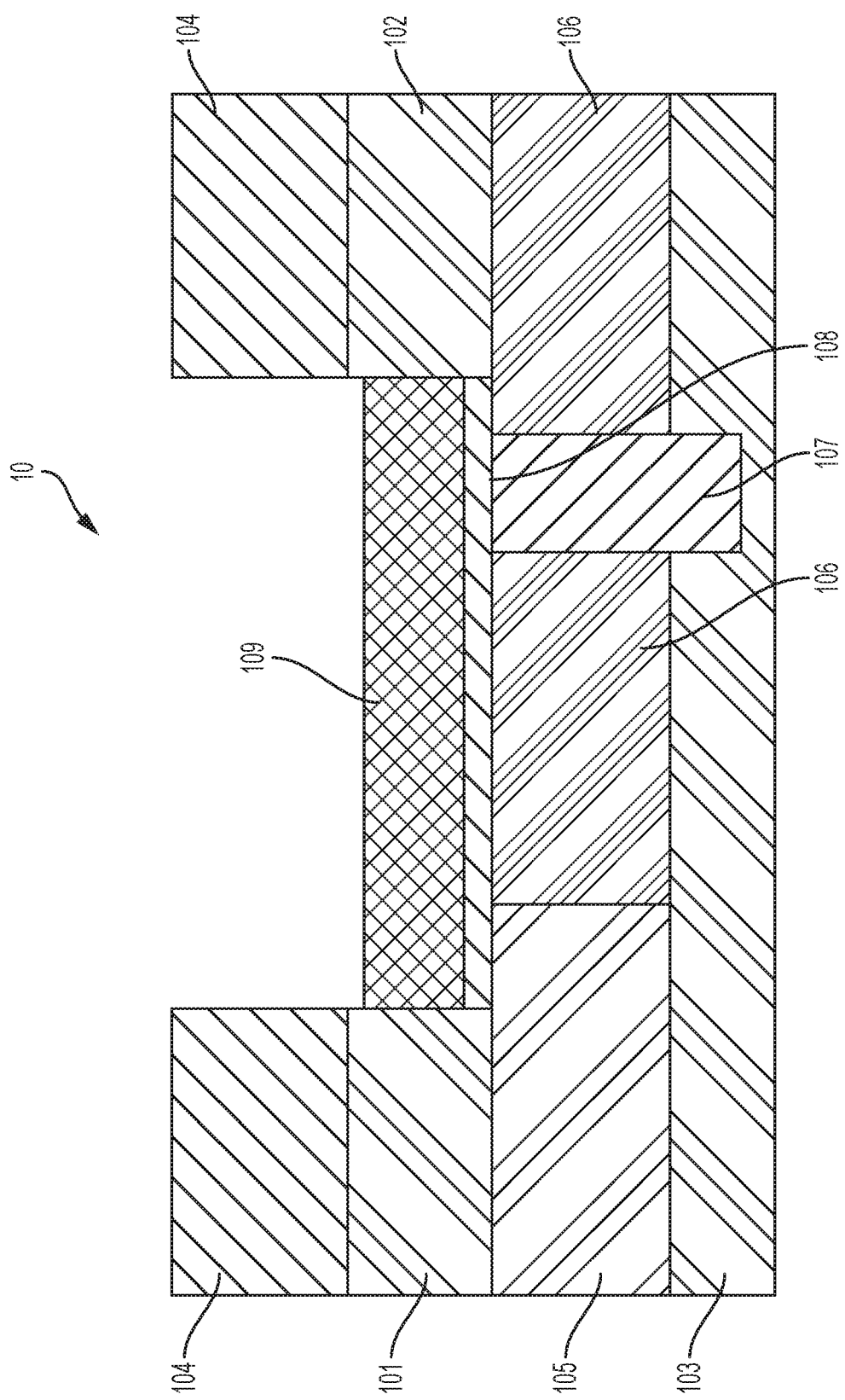
FIG. 1 depicts a semiconductor device after a fabrication operation according to embodiments of the invention.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of laminated inductor devices are well known and so, in the interest of brevity, many conventional steps will only be mentioned briefly herein or will be omitted entirely without providing the well-known process details.

Turning now to an overview of the aspects of the invention, as discussed previously herein, the scaling of conventional sub-10 nm VFET-based SRAM devices is bottlenecked by the feature-to-feature spacing requirements, which cannot be reduced below a certain level because certain tolerances must be maintained in order to compensate for overlay errors that result from the use of lithography-based processes to form certain features. Embodiments of the invention address the above-described shortcomings of known VFET fabrication processes by providing fabrication methods and resulting structures based on novel self-alignment fabrication operations that reduce the reliance on lithography-based fabrication processes, thereby enabling reductions in feature-to-feature spacing requirements and enabling an ultimate reduction in the footprint of the VFET.

In some embodiments of the invention, the feature-to-feature spacing requirement is a contact-to-gate spacing requirement, and the VFET is fabricated using a self-aligned contact (SAC) process to form a buried contact. Because the SAC process does not rely on lithography-based fabrication processes, there is no need to include in contact-to-gate spacing requirements sufficient tolerance to compensate for overlay errors inherent in lithography-based fabrication processes.

In some embodiments of the invention, prior to formation of the buried contact, a gate material is deposited and a first spacer is conformally formed over the gate material. The first spacer is formed from a first dielectric material. The gate material and the first spacer are patterned to define an nFET gate and a pFET gate. A second spacer is formed after patterning the gates. The second spacer is formed from a second dielectric material.

In embodiments of the invention, the first and second spacers enable a novel application of a SAC process for forming a buried contact between the nFET gate and the pFET gate. During the described SAC process the buried contact is formed in an enclosed region defined by the spacers. The spacers ease contact misalignment tolerances by preventing the buried contact from electrically shorting to the gates.

Moreover, in contrast to conventional VFET-based SRAM devices in which the bottom source/drain (S/D) contact is separated from the nFET gate by a relatively wide dielectric region, the buried contact need only be separated from the gates by the thickness of the second spacer, which can be fabrication to a relatively thin (e.g., from about 5 nanometers to about 12 nanometers) thickness level. In other words, the minimum required contact-to-gate spacing is defined by the thickness of the second spacer.

In this manner, a VFET device having a reduced contact-to-gate spacing requirement is provided. The VFET device can be used to form SRAM. When compared to VFET-based SRAM devices formed by conventional methods, which can require a contact-to-gate separation of about 32 nanometers, the SRAM device having a self-aligned buried contact offers a significant footprint reduction. Accordingly, the overall size of each SRAM device, as well as the device-to-device fin pitch, can be made smaller, and increased device density requirements can be achieved.

Turning now to a more detailed description of aspects of the present invention, FIG. 1 depicts a cross-sectional view of a VFET-based SRAM device structure 10 after various fabrication operations according to one or more embodiments of the invention. Known fabrication operations have been utilized to form the structure 10 at the stage of fabrication shown in FIG. 1. The structure 10 includes a substrate 103, an nFET active region 105, a pFET active region 106, a shallow trench isolation (STI) 107, a bottom spacer 108, a gate material 109, an nFET semiconductor fin 101, a pFET semiconductor fin 102, and hard mask regions 104, configured and arranged as shown.

The structure 10 shown in FIG. 1 includes two complementary VFETs side by side over substrate 103. Each of VFETs has a bottom S/D region and a channel fin. Thus, the n-type VFET has nFET active region 105 and semiconductor fin 101, respectively. Similarly, the p-type VFET has pFET active region 106 and semiconductor fin 102, respectively.

The substrate 103 can be made of any suitable substrate material, for example, Si, SiGe, SiC, Group III-V compound semiconductor, Group II-VI compound semiconductor, or semiconductor-on-insulator (SOI). For example, in embodiments where the nFET semiconductor fin 101 and pFET semiconductor fin 102 are made of InGaAs, the substrate 103 can be InP. In some embodiments of the invention, the substrate 103 includes a buried oxide layer (not depicted).

The nFET active region 105 and the pFET active region 106 are formed over the substrate 103. The shallow trench isolation (STI) 107 is also formed over the substrate 103. The STI 107 prevents electrical current leakage between adjacent semiconductor device components (e.g., between adjacent semiconductor fins). The STI 107 can be of any suitable dielectric material, for example, a silicon oxide. Any known manner of forming the STI 107 can be utilized. In some embodiments, the STI 107 is formed by etching back a portion of the substrate 103 to form a trench, filling the trench with the STI 107 material, and planarizing to a surface of the substrate 103 using, for example, a chemical-mechanical planarization (CMP) process.

Each of the nFET active region 105 and the pFET active region 106 can be formed by a variety of methods, for example, diffusion, ion implantation of a dopant into the substrate, or in-situ doped epitaxy. More specifically, the nFET active region 105 and the pFET active region 106 will form the bottom S/D regions of adjacent VFET devices in the final fabricated semiconductor device.

The nFET active region 105 and the pFET active region 106 have complementary doping. Complementary doping of semiconducting materials, which entails the creation of specified n-type regions (i.e., regions where the conductivity is dominated by electrons) and p-type regions (i.e. regions where the conductivity is dominated by holes), is necessary for the formation of complementary metal oxide semiconductor (CMOS) circuitry that is found in many modern electronic devices.

In some embodiments, each of the nFET active region 105 and the pFET active region 106 includes epitaxial semiconductor materials grown from gaseous or liquid precursors. In some embodiments, epitaxial regions are epitaxially grown over the substrate 103. Epitaxial semiconductor materials can be grown using vapor-phase epitaxy (VPE), MBE, liquid-phase epitaxy (LPE), or other suitable processes. Epitaxial silicon, SiGe, and/or carbon doped silicon (Si:C) can be doped during deposition (in-situ doped) by adding dopants, n-type dopants (e.g., phosphorus or arsenic) or p-type dopants (e.g., Ga, B, $BF_2$, or Al). The dopant concentration in the doped regions can range from $1 \times 10^{19}$ cm$^{-3}$ to $2 \times 10^{21}$ cm$^{-3}$, or between $1 \times 10^{20}$ cm$^{-3}$ and $1 \times 10^{21}$ cm$^{-3}$.

The nFET semiconductor fin 101 and the pFET semiconductor fin 102 are formed over the nFET active region 105 and the pFET active region 106, respectively. The nFET semiconductor fin 101 and the pFET semiconductor fin 102 can be formed using known front-end-of-line (FEOL) fabrication techniques.

For example, in one of the initial fabrication processes, a layer of hard mask material can be deposited on the substrate 103 and then etched to form the hard masks 104, which cover the portions of the substrate 103 where the fins will be formed. The hard masks 104 can be any suitable material, for example, a nitride or silicon nitride. An etch is applied such that the portions of the substrate 103 that are not covered by the hard masks 104 are removed to form the nFET and pFET semiconductor fins 101, 102.

In some embodiments of the invention, the nFET semiconductor fin 101 and pFET semiconductor fin 102 are formed by epitaxially growing semiconductor materials from gaseous or liquid precursors. Epitaxial semiconductor materials can be grown using vapor-phase epitaxy (VPE), molecular beam epitaxy (MBE), liquid-phase epitaxy (LPE), or other suitable processes.

The nFET semiconductor fin 101 and pFET semiconductor fin 102 can be made of any suitable material, for example, Si, SiGe, Group III-V compound semiconductor, or other suitable materials. In some embodiments of the invention, the gas source for the deposition of epitaxial semiconductor material includes a silicon, a germanium, or a Group III-V compound semiconductor containing gas source, or a combination thereof. For example, an epitaxial InGaAs layer can be deposited from a gas source that is selected from the group consisting of arsine, trimethyl indium, and trimethyl gallium. In another example, an epitaxial germanium layer can be deposited from a germanium gas source that is selected from the group consisting of germane, digermane, halogermane, dichlorogermane, trichlorogermane, tetrachlorogermane and combinations thereof. In yet another example, an epitaxial silicon germanium alloy layer can be formed utilizing a combination of such gas sources. Carrier gases like hydrogen, nitrogen, helium and argon can be used. In some embodiments of the invention, the nFET semiconductor fin 101 and pFET semiconductor fin 102 include silicon. In some embodiments of the invention, the nFET semiconductor fin 101 and pFET semiconductor fin 102 include carbon doped silicon (Si:C). This Si:C layer can be grown in the same chamber used for other epitaxy steps or in a dedicated Si:C epitaxy chamber. The Si:C can include carbon in the range of about 0.2 percent to about 3.0 percent.

The nFET semiconductor fin 101 and pFET semiconductor fin 102 can be made of any suitable material, for example, Si, SiGe, Group III-V compound semiconductor, or other suitable materials. Group III-V compound semiconductors include materials having at least one group III element and at least one group V element, for example, one or more of aluminum gallium arsenide (AlGaAs), aluminum gallium nitride (AlGaN), aluminum arsenide (AlAs), aluminum indium arsenide (AlIAs), aluminum nitride (AlN), gallium antimonide (GaSb), gallium aluminum antimonide (GaAlSb), gallium arsenide (GaAs), gallium arsenide antimonide (GaAsSb), gallium nitride (GaN), indium antimonide (InSb), indium arsenide (InAs), indium gallium arsenide (InGaAs), indium gallium arsenide phosphide (InGaAsP), indium gallium nitride (InGaN), indium nitride (InN), indium phosphide (InP) and alloy combinations including at least one of the foregoing materials. The alloy combinations can include binary (two elements, e.g., gallium (III) arsenide (GaAs)), ternary (three elements, e.g., InGaAs) and quaternary (four elements, e.g., aluminum gallium indium phosphide (AlInGaP)) alloys.

The bottom spacer 108 is formed opposite surfaces of the nFET active region 105 and the pFET active region 106. The bottom spacer 108 can include a high-k dielectric for example, silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials can further include dopants such as lanthanum and aluminum.

In some embodiments, the bottom spacer 108 is formed by performing a deposition process for example, a Gas Cluster Ion Beam (GCIB) process. The GCIB process is a deposition process that can be highly directional in nature. For example, the directional deposition process can result in the deposition of dielectric material on the horizontally oriented surfaces of the structure, such as the upper surface the nFET active region 105 and pFET active region 106, while avoiding deposition of any substantial amount of dielectric material on the vertically-oriented surfaces of the structure, such as sidewalls of the nFET semiconductor fin 101, the pFET semiconductor fin 102, and the hard masks 104.

The gate material 109 is deposited opposite a surface of the bottom spacer 108. The gate material 109 can be made of any suitable conducting material, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials.

The gate material 109 can be deposited using known metallization techniques. In some embodiments of the invention, a RIE selective to the hard masks 104 recesses the gate material 109 below a surface of the hard masks 104.

Figure 2:
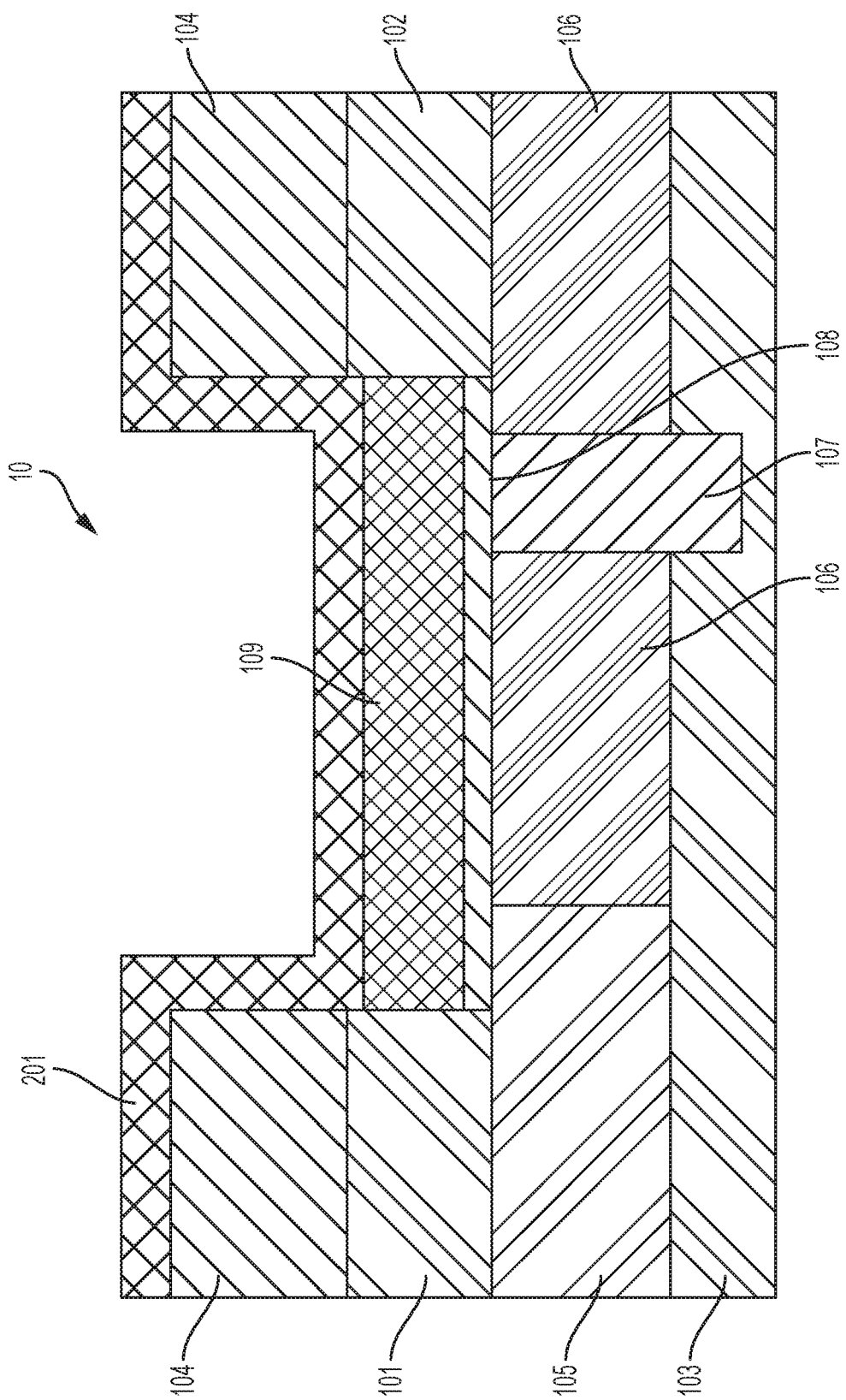
FIG. 2 depicts a semiconductor device after a fabrication operation according to embodiments of the invention.
Figure 4:
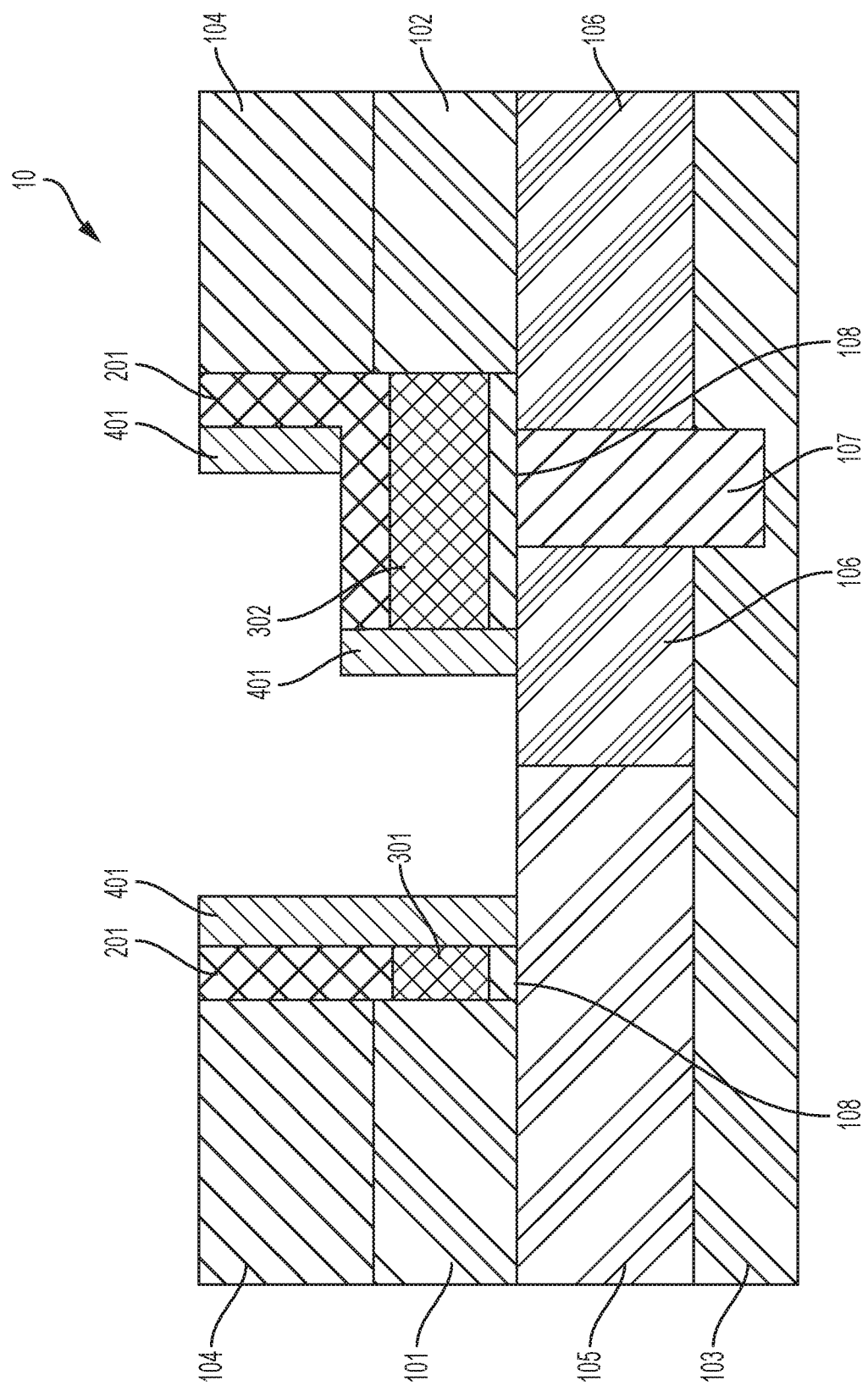
FIG. 4 depicts a semiconductor device after a fabrication operation according to embodiments of the invention.

FIG. 2 depicts a cross-sectional view of the structure 10 after a first spacer 201 has been deposited on the structure 10. In accordance with embodiments of the invention, the first spacer 201 is formed from a first dielectric material, which is selected such that a material in the hard masks 104 and a second dielectric material in a second spacer 401 (as depicted in FIG. 4) has an etch selectivity relative to the first dielectric material. Examples of such a first dielectric material include SiCO (carbon-doped silicon oxide), SiOF (fluorine-doped silicon oxide), SiC, and Al$_2$O$_3$. In some embodiments of the invention, the first spacer 201 is made of SiCO. Formation of the second spacer 401 on the first spacer 201 will be further described below with reference to FIG. 4.

In embodiments of the invention, the first spacer 201 can be conformally deposited on the structure 10. Conformal deposition refers to deposition of a generally uniform layer of material on a surface in the same shape as the surface, i.e., including on vertically-oriented surfaces of the structure 10. In some embodiments of the invention, the first spacer 201 is formed using a chemical vapor deposition (CVD), plasma-enhanced chemical vapor deposition (PECVD), atomic layer deposition (ALD), physical vapor deposition (PVD), chemical solution deposition, or other like process.

Figure 3:
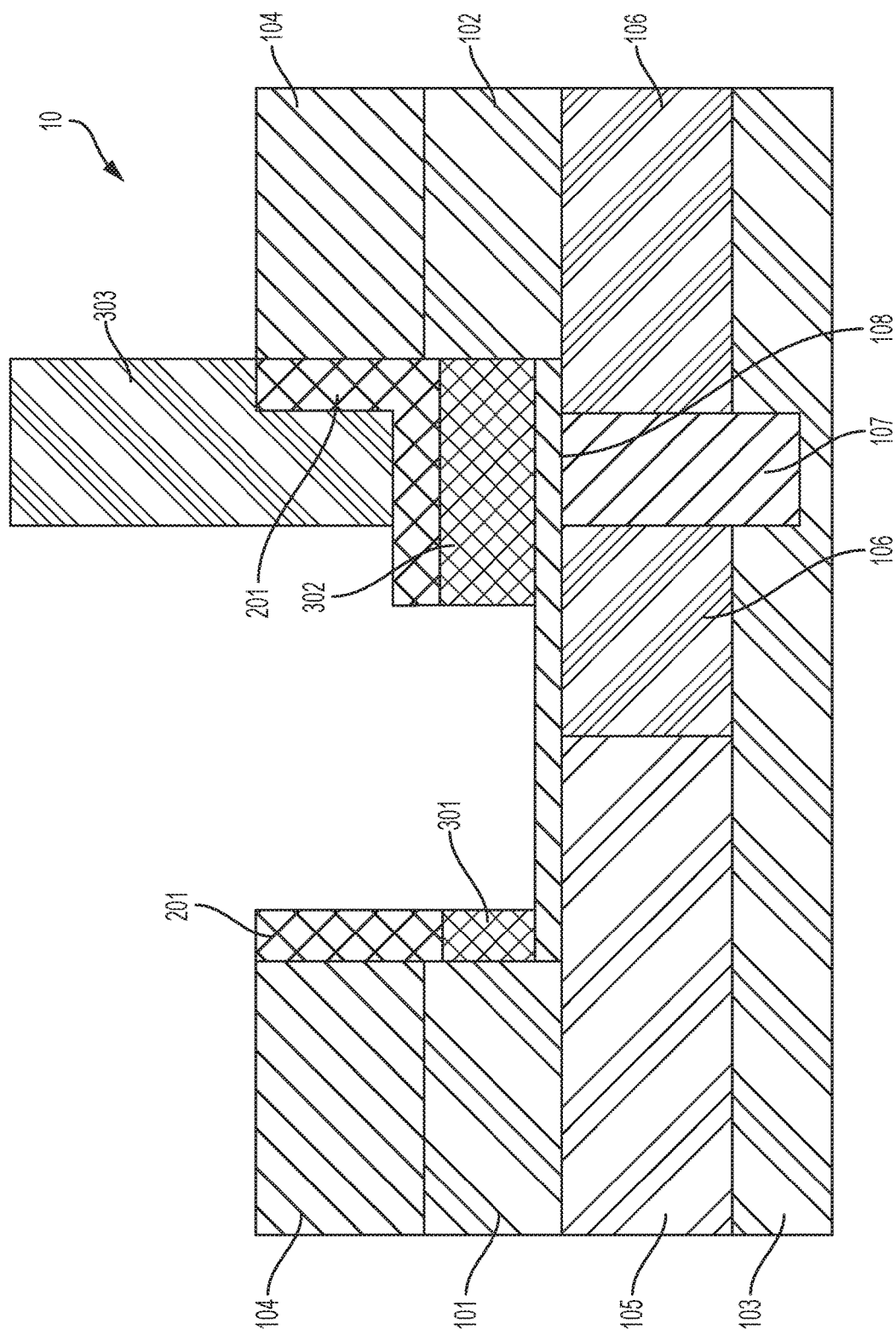
FIG. 3 depicts a semiconductor device after a fabrication operation according to embodiments of the invention.

FIG. 3 depicts a cross-sectional view of the structure 10 after a gate patterning operation in which portions of the first spacer 201 and the gate material 109 are etched to form an nFET gate 301 and a pFET gate 302, and to expose an upper surface of a portion of the bottom spacer 108. In some embodiments of the invention, the nFET gate 301 and the pFET gate 302 are formed, for example, by a lithographic patterning and RIE of the first spacer 201 and the gate material 109.

As shown and previously described, each of the complementary VFETs shown in FIG. 3 has a bottom S/D region and a channel fin. Additionally, each of the complementary VFETs shown in FIG. 3 has a gate that surrounds the sidewalls of the channel fin. Thus, the n-type VFET has nFET active region 105, semiconductor fin 101, and nFET gate 301 that surrounds the sidewalls of the semiconductor fin 101, respectively. Similarly, the p-type VFET has pFET active region 106, semiconductor fin 102, and pFET gate 302 that surrounds the sidewalls of the semiconductor fin 102, respectively.

FIG. 3 also depicts that an organic planarization layer (OPL) 303 has been deposited opposite a surface of the first spacer 201 that is opposite a surface of the pFET gate 302. The OPL 303 protects sections of the first spacer 201 and the gate material 109 and allows for etching of portions of the first spacer 201 and the gate material 109 to form the nFET gate 301 and the pFET gate 302. The OPL 303 can include an organic-based planarization material. Exemplary organic planarization materials include polyacrylate resin, epoxy resin, phenol resin, polyamide resin, polyimide resin, unsaturated polyester resin, polyphenylenether resin, and polyphenylene sulfide resin. The OPL 303 can be formed using a variety of methods including spinning coating, spray coating, dip coating, roller coating, and the like.

As noted in the above description of the gate patterning operation, portions of the first spacer 201 and the gate material 109 are removed to provide an opening to an exposed portion of the bottom spacer 108. The portions of the first spacer 201 can be removed using a selective etch process that removes the relevant portions of the first spacer 201 selective to the hard mask 104. The etch can be an isotropic etch, which is non-directional. In some embodiments of the invention, the isotropic etch is a wet chemical etch.

FIG. 4 depicts a cross-sectional view of the structure 10 after a fabrication operation in which the OPL 303 and the exposed portion of the bottom spacer 108 are removed and a set of second spacers 401 is formed. Following etching of portions of the first spacer 201 and the gate material 109 to form the nFET gate 301 and the pFET gate 302, the OPL, which was deposited to protect sections of the first spacer 201 and the gate material 109 during the etching, can be removed. The OPL 303 and the exposed portion of the bottom spacer 108 can be removed using a variety of methods including an anisotropic etch (e.g., a RIE), chemical wet etching, sulfuric acid stripping, and the like.

In embodiments of the invention, the second spacers 401 are formed from a second dielectric material. The second spacers 401 can be formed in the following manner. Subsequent to removing the exposed portion of the bottom spacer 108, the second dielectric material is conformally deposited on the structure 10. In some embodiments of the invention, the second dielectric material is deposited using a CVD, PECVD, ALD, PVD, chemical solution deposition, or other like process. The second dielectric material can include an oxide, for example, silicon dioxide.

The second dielectric material is etched to form the set of second spacers 401 on sidewalls of the bottom spacer 108, the first spacer 201, the nFET gate 301, and the pFET gate 302 as depicted in FIG. 4. Etching the second dielectric material can be performed using an anisotropic etch, which is directional. The anisotropic etch can include reactive-ion etching (RIE). Other examples of anisotropic etching that can be used include ion beam etching, plasma etching or laser ablation. The second spacers 401 can each have a thickness with a range from about 5 nanometers to about 12 nanometers.

As previously described in connection with the description of FIG. 2, the first dielectric material used to form the first spacer 201 is selected such that the hard mask 104 and the second dielectric material of the second spacer 401 each have an etch selectivity relative to the first dielectric material. For example, the first spacer 201 can include SiCO (carbon-doped silicon oxide), SiOF (fluorine-doped silicon oxide), SiC, or $Al_2O_3$. In this manner, the hard mask 104 and the second spacer 401 can be etched selective to the first spacer 201.

As also previously described, and as will be further appreciated and described with reference to FIGS. 7-11, the second spacer 401 having a thickness within the range from about 5 nanometers to about 12 nanometers will provide spacing between the nFET gate 301 and a buried contact 701 (shown in FIG. 7). Formation of the buried contact 701 will be further described below in connection with the description of the fabrication operations shown in FIG. 7.

Figure 5:
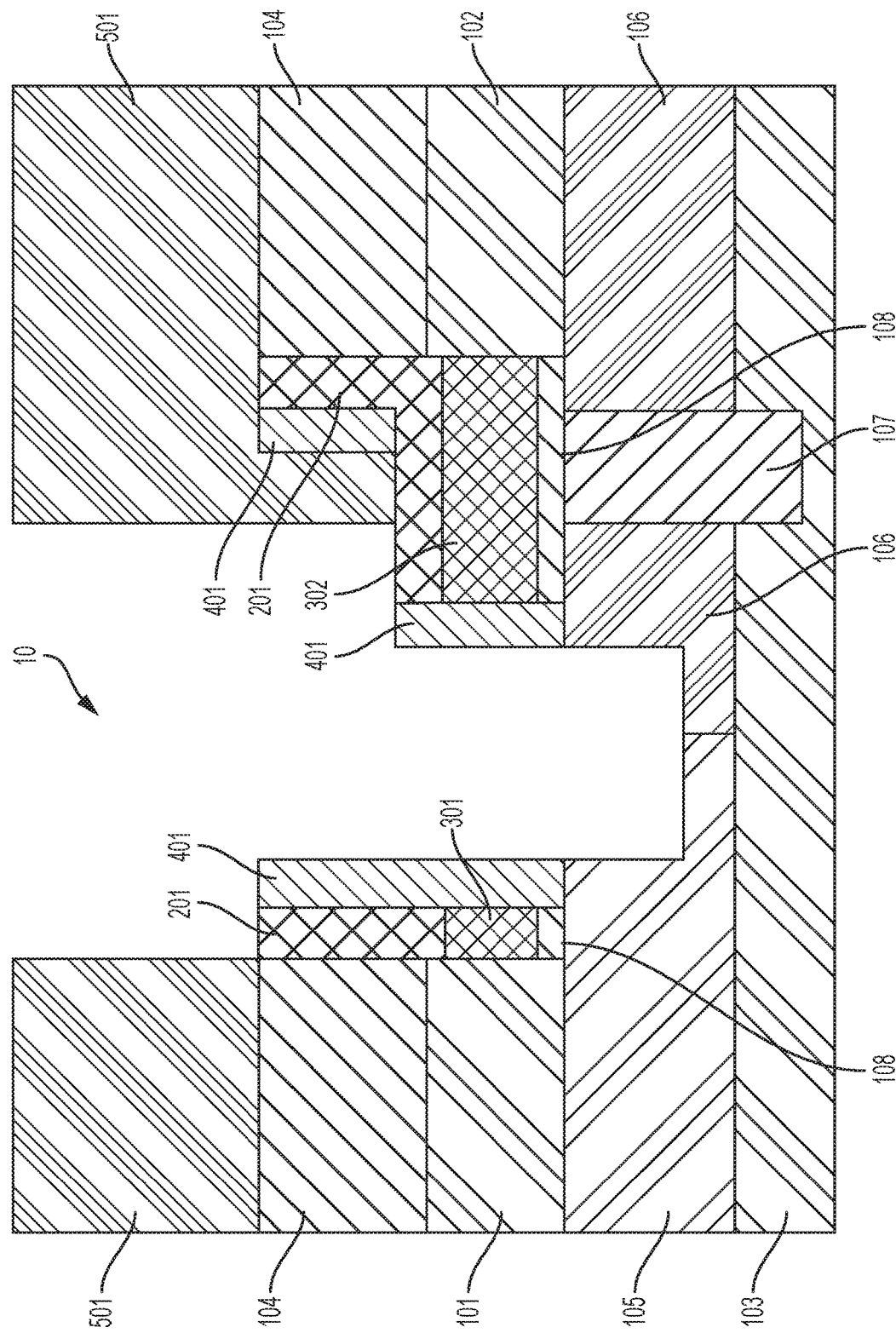
FIG. 5 depicts a semiconductor device after a fabrication operation according to embodiments of the invention.

FIG. 5 depicts a cross-sectional view of the structure 10 after a fabrication operation in which a set of OPLs 501 is deposited and a portion of each of the nFET active region 105 and the pFET active region 106 is etched.

The OPLs 501 are deposited on upper surfaces of the hard mask 104, the first spacers 201, and one of the second spacers 401. The OPL 501 can include an organic-based planarization material. Exemplary organic planarization materials include polyacrylate resin, epoxy resin, phenol resin, polyamide resin, polyimide resin, unsaturated polyester resin, polyphenylenether resin, and polyphenylene sulfide resin. The OPL 501 can be formed by a variety of methods including spin coating, spray coating, dip coating, roller coating, and the like.

FIG. 5 also depicts a fabrication operation in which a trench is formed in the nFET active region 105 and the pFET active region 106 by etching exposed portions of the nFET active region 105 and the pFET active region 106. The exposed portions of the nFET active region 105 and the pFET active region 106 are etched selective to the exposed first spacers 201, the exposed second spacer 401, and the OPL 501. The leftmost OPL 501 covers and prevents etching of the leftmost hard mask 104, while the rightmost OPL 501 covers and prevents etching of the rightmost hard mask 104, the rightmost first spacer 201, and the rightmost second spacer 401.

In some embodiments of the invention, the trench in the nFET active region 105 and pFET active region 106 can be formed by patterning the OPL 501 and using known lithographic processes to transfer the pattern to the nFET active region 105 and the pFET active region 106 to form the trench. The lithographic process can include applying a photoresist layer (not depicted) atop the OPL 501, exposing the photoresist layer to a desired pattern of radiation, and developing the exposed photoresist layer utilizing a resist developer. The etching process can include dry etching and/or wet chemical etching. Examples of dry etching processes that can be used include RIE, ion beam etching, plasma etching or laser ablation. The etching process transfers the pattern from the patterned photoresist layer to the OPL 501, the nFET active region 105, and the pFET active region 106. After forming the trench in nFET active region 105 and pFET active region 106, the patterned photoresist layer can be removed utilizing a resist stripping process for example, ashing.

Figure 6:
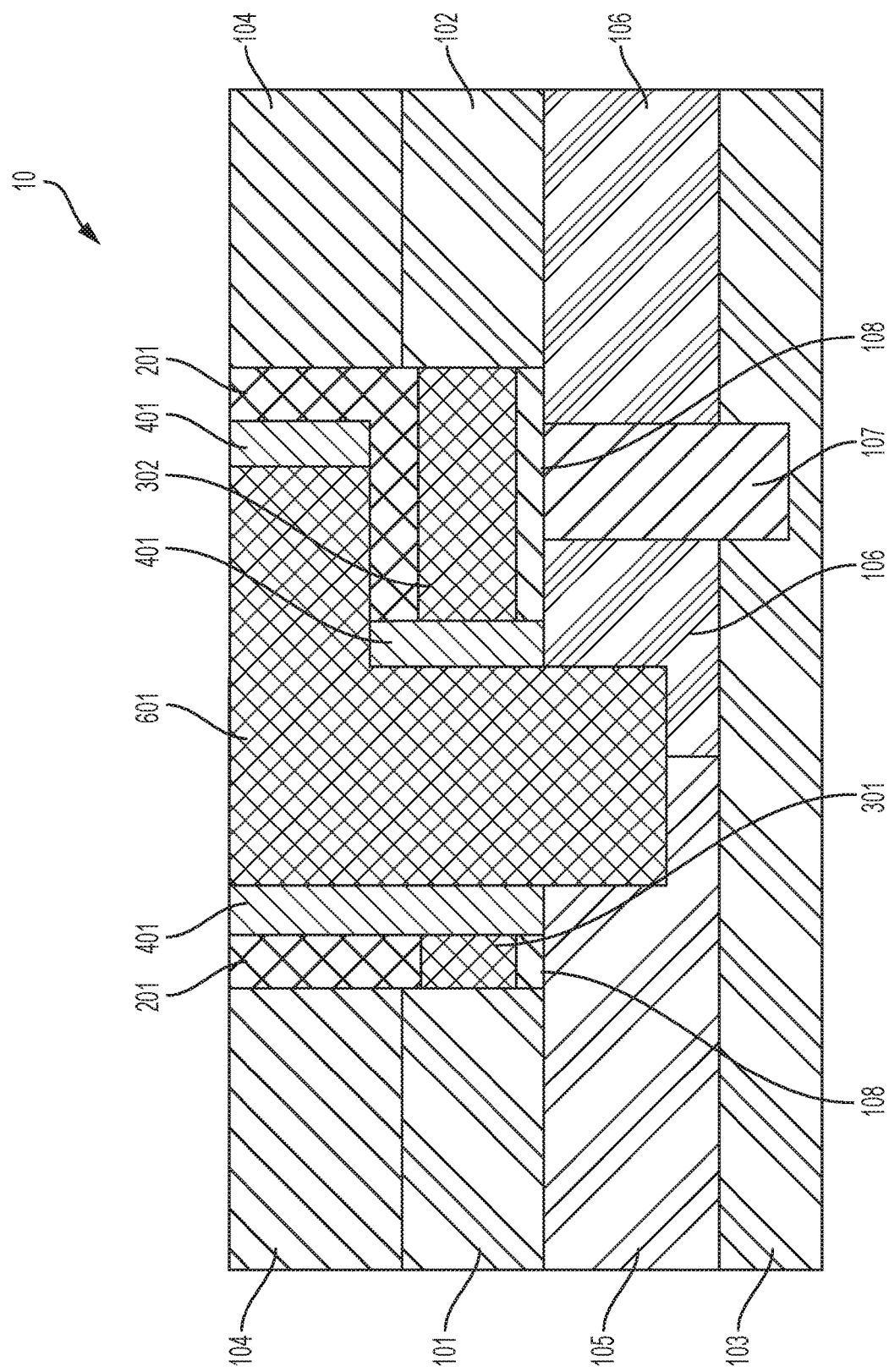
FIG. 6 depicts a semiconductor device after a fabrication operation according to embodiments of the invention.

FIG. 6 depicts a cross-sectional view of the structure 10 after a fabrication operation in which the OPL 501 has been removed and a contact material 601 has been deposited in the trench that was previously formed in the nFET active region 105 and pFET active region 106 and between remaining portions of the second spacer 401. The OPL 501 can be removed by an anisotropic etch, for example, a RIE, or by chemical wet etching, or by sulfuric acid stripping.

The contact material 601 can be made of any suitable conducting material, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. In some embodiments of the invention, the contact material 601 includes a same material as the gate material 109, and accordingly, a same material as the nFET gate 301 and the pFET gate 302.

The contact material 601 can be deposited using known metallization techniques. In some embodiments of the invention, the contact material 601 is overfilled into the trench formed in the nFET active region 105 and the pFET active region 106 and between remaining portions of the second spacer 401, forming an overburden above a surface of the hard masks 104, the first spacers 201, and the second spacers 401. In some embodiments of the invention, a CMP selective to the hard masks 104, the first spacers 201, and the second spacers 401 removes the overburden.

Figure 7:
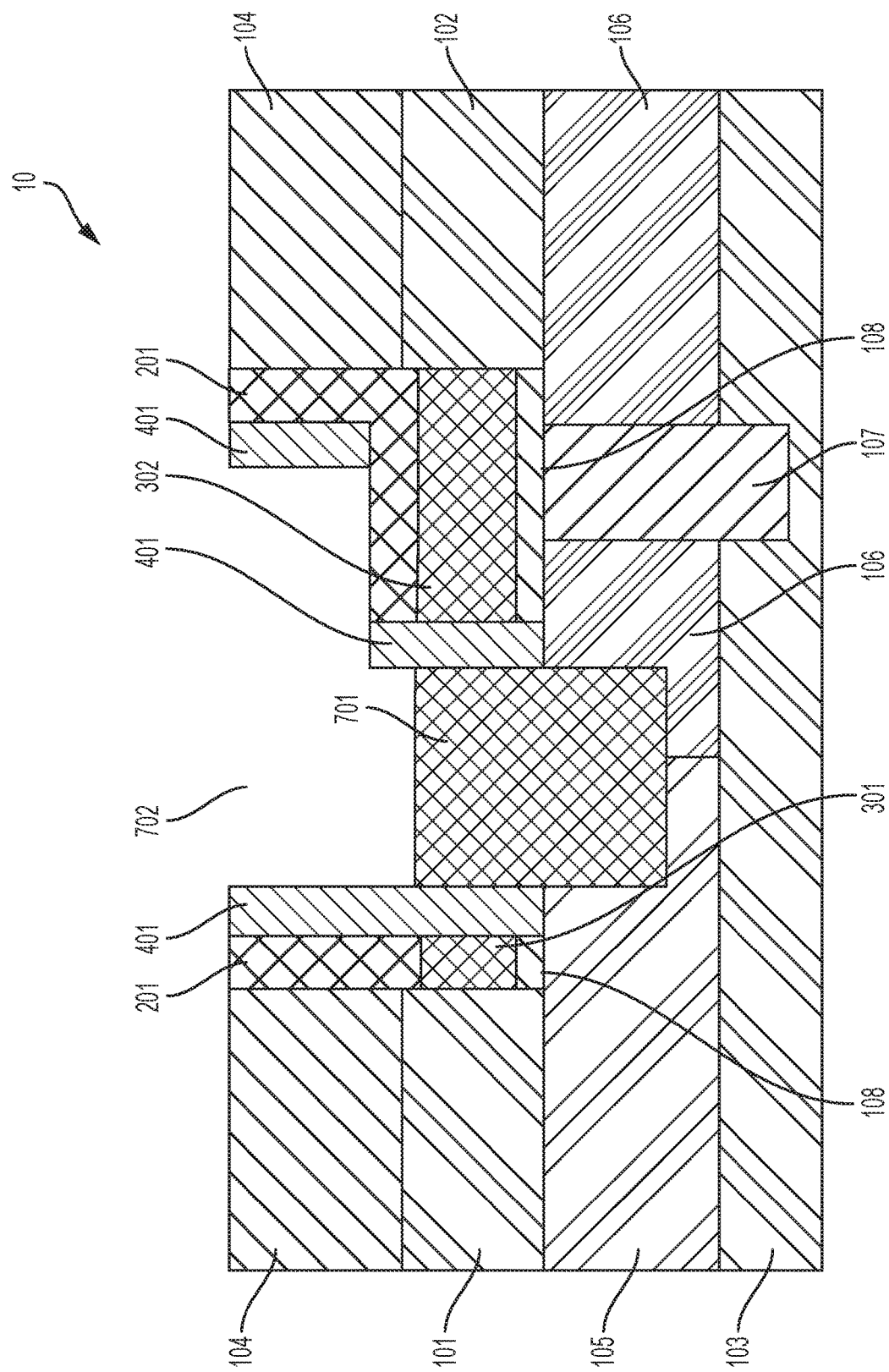
FIG. 7 depicts a semiconductor device after a fabrication operation according to embodiments of the invention.

FIG. 7 depicts a cross-sectional view of the structure 10 after the buried contact 701 has been formed by recessing the contact metal 601, for example, by RIE. In some embodiments of the invention, the contact metal 601 is recessed below a surface of the leftmost and rightmost second spacers 401. Recessing the contact metal 601 to form the buried contact 701 also forms a trench 702 defined by an upper surface of the buried contact 701, exposed portions of the second spacers 401 and an upper surface of the rightmost first spacer 201.

Accordingly, FIGS. 1-7 depict an example of performing a SAC process to form the buried contact 701 in accordance with aspects of the present invention. Using the previously described fabrication operations, a region for metal deposition was created and defined by the space between the leftmost second spacer 401 and the centrally located second spacer 401, as well as by the trench that was previously formed in the nFET active region 105 and the pFET active region 106. The enclosed metal deposition region enables the buried contact 701 to self-align to the second spacer 401 along sidewalls of the nFET gate 301 and the pFET gate 302, and also enables the buried contact 701 to be formed using a deposition and etch back process. Boundaries of the buried contact 701 are further defined by the first spacers 201, which prevent a short to the pFET gate 302.

As previously described, in accordance with aspects of the invention, the second spacers 401 are provided with a thickness in the range from about 5 nanometers to about 12 nanometers, which provides spacing between the nFET gate 301 and the buried contact 701 of from about 5 nanometers to about 12 nanometers. As will be further appreciated and described with reference to FIGS. 8-11, a conductive contact will be formed contacting the buried contact 701 and the pFET gate 302.

Figure 8:
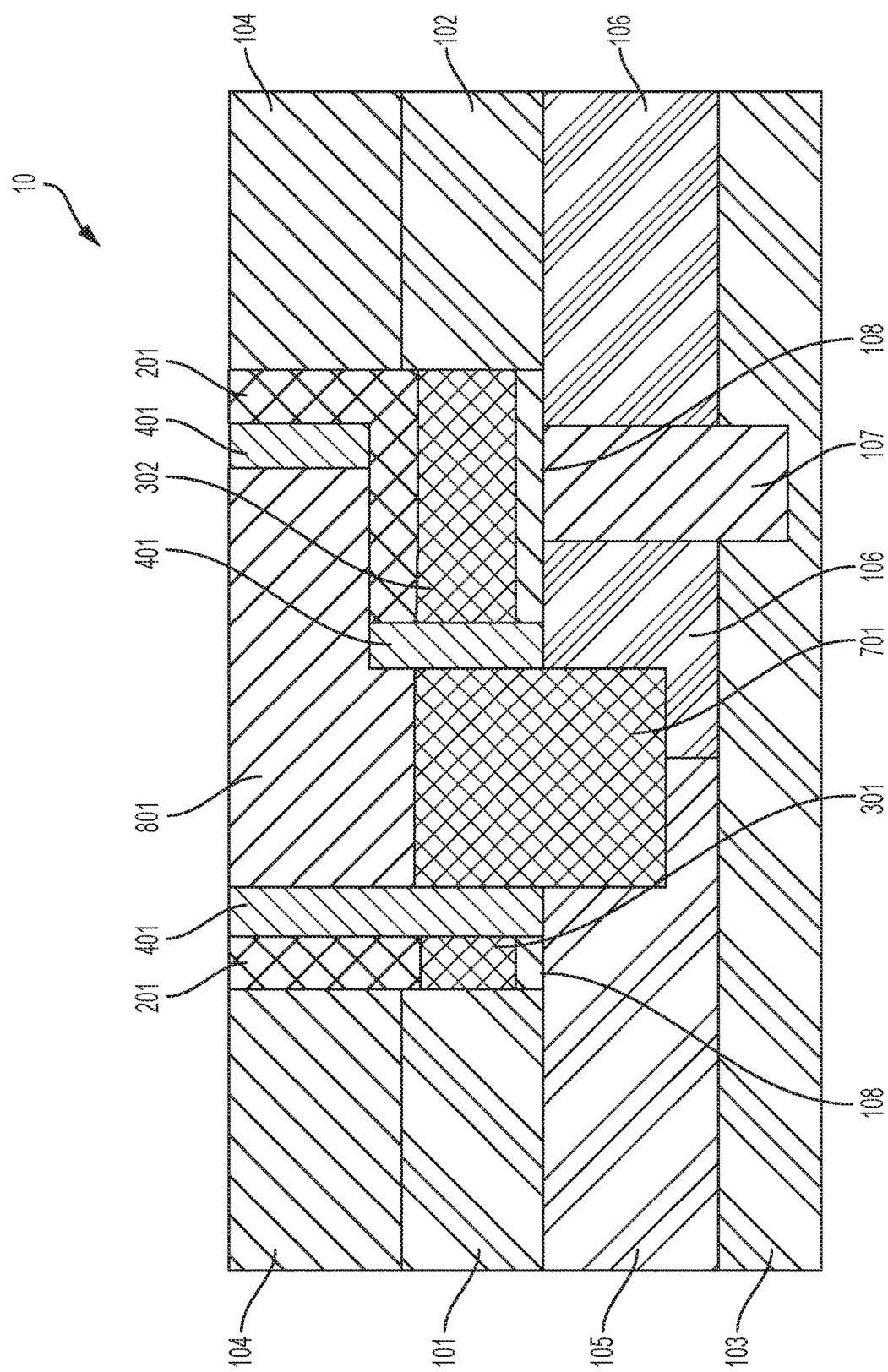
FIG. 8 depicts a semiconductor device after a fabrication operation according to embodiments of the invention.

FIG. 8 depicts a cross-sectional view of the structure 10 after an interlayer dielectric (ILD) 801 is deposited in the trench 702 (shown in FIG. 7). The ILD 801 can be formed using any known deposition process such as a spin-on coating operation. The ILD 801 can be any suitable material, for example, an oxide.

In some embodiments of the invention, the ILD 801 is overfilled into the trench 702 (shown in FIG. 7) to form an overburden above a surface of the hard masks 104, the first spacer 201, and the second spacer 401. In some embodiments of the invention, a CMP selective to the hard masks 104, the first spacers 201, and the second spacers 401 can be utilized to remove the overburden.

Figure 9:
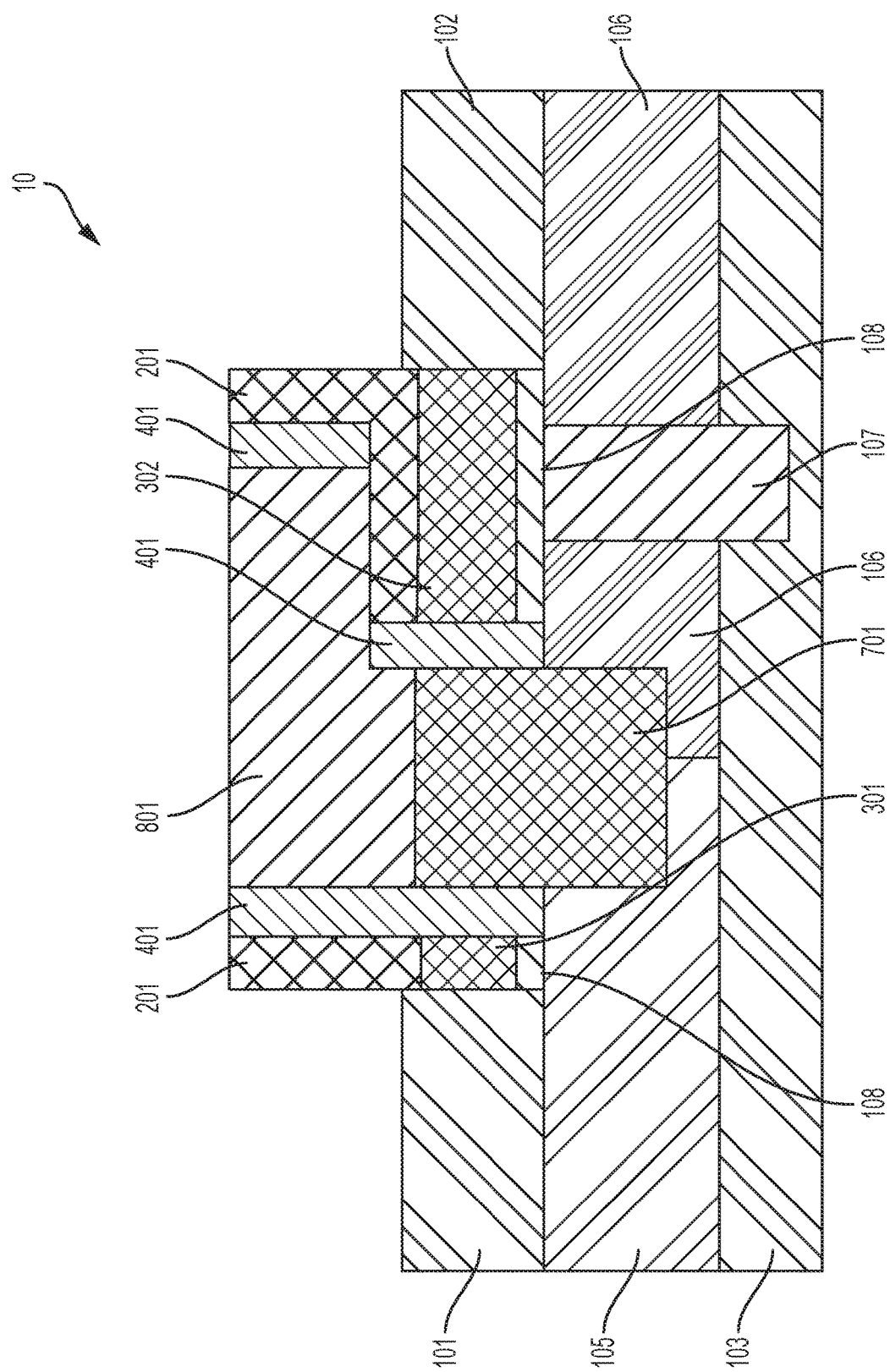
FIG. 9 depicts a semiconductor device after a fabrication operation according to embodiments of the invention.

FIG. 9 depicts a cross-sectional view of the structure 10 after a fabrication operation in which the hard masks 104 have been removed using an etch process. The etch process can be a wet etch process, a dry etch process or a combination thereof.

As previously described, the first dielectric material used to form the first spacers 201 is selected such that a material used to form the hard masks 104 has an etch selectivity relative to the first dielectric material. For example, the first spacers 201 can include SiCO (carbon-doped silicon oxide), SiOF (fluorine-doped silicon oxide), SiC, or $Al_2O_3$.

Accordingly, the hard masks 104 are etched selective to the first spacers 201. The hard masks 104 are also etched selective to the second spacers 401. The nFET semiconductor fin 101 and the pFET semiconductor fin 102 can then be doped with n-type (e.g., As, P, Sb) or p-type dopants (e.g., B, $BF_2$, Al, Ga), respectively.

Figure 10:
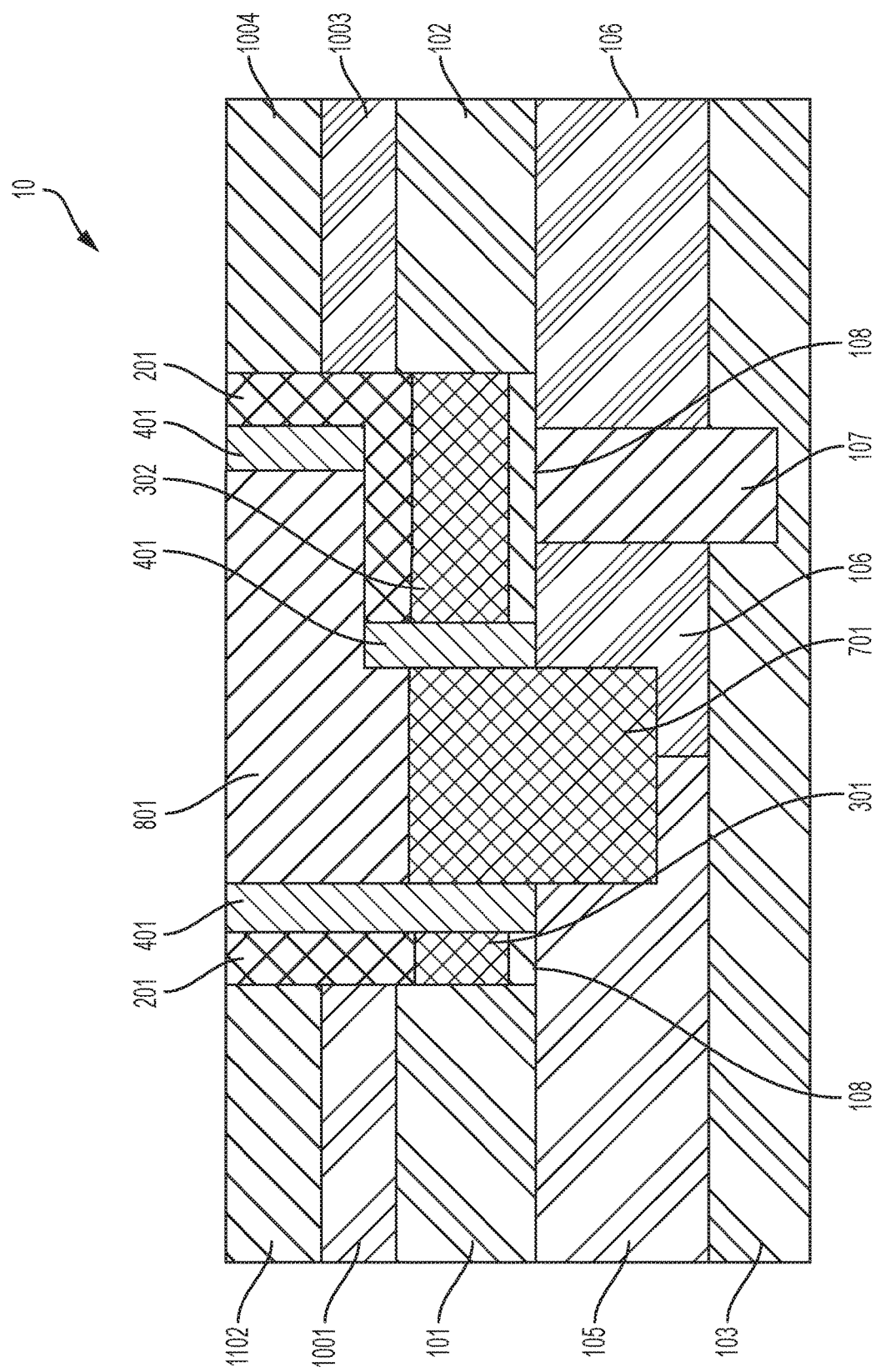
FIG. 10 depicts a semiconductor device after a fabrication operation according to embodiments of the invention.

FIG. 10 depicts a cross-sectional view of the structure 10 after a fabrication operation in which S/D regions 1001 and 1003 are formed, followed by formation of cap layers 1002 and 1004 on the source/drain regions 1001 and 1003, respectively. As shown and previously described, each of the complementary VFETs shown in FIG. 10 has a bottom S/D region, a channel fin, and a gate that surrounds the sidewalls of the channel fin. Additionally, each of the complementary VFETs shown in FIG. 10 has a top S/D region. Thus, the n-type VFET has nFET active region 105, semiconductor fin 101, nFET gate 301 that surrounds the sidewalls of the semiconductor fin 101, and source/drain region 1001, respectively. Similarly, the p-type VFET has pFET active region 106, semiconductor fin 102, pFET gate 302 that surrounds the sidewalls of the semiconductor fin 102, and source/drain region 1003, respectively.

Source/drain regions 1001 and 1003 are formed opposite exposed surfaces of the nFET semiconductor fin 101 and pFET semiconductor fin 102, respectively. The source/drain regions 1001 and 1003 can be formed by any suitable process, including but not limited to, ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing chemical vapor deposition (LRPCVD), and MBE.

In some embodiments of the invention, the source/drain regions 1001 and 1003 include epitaxial semiconductor materials grown from gaseous or liquid precursors using VPE, MBE, LPE, or other suitable processes. The source/drain regions 1001 and 1003 can be made of any suitable material, for example, Si, SiGe, Group III-V compound semiconductor, or other suitable materials. In some embodiments of the invention, the source/drain regions 1001 and 1003 are raised source/drain regions formed from III-V compound semiconductor material. In some embodiments of the invention, the gas source for the deposition of epitaxial semiconductor material includes a silicon, a germanium, or a Group III-V compound semiconductor containing gas source, or a combination thereof. For example, an epitaxial InGaAs layer can be deposited from a gas source that is selected from the group consisting of arsine, trimethyl indium, and trimethyl gallium. In another example, an epitaxial germanium layer can be deposited from a germanium gas source that is selected from the group consisting of germane, digermane, halogermane, dichlorogermane, trichlorogermane, tetrachlorogermane and combinations thereof. In yet another example, an epitaxial silicon germanium alloy layer can be formed utilizing a combination of such gas sources. Carrier gases like hydrogen, nitrogen, helium and argon can be used. In some embodiments of the invention, the source/drain regions 1001 and 1003 include silicon. In some embodiments of the invention, the source/drain regions 1001 and 1003 include carbon doped silicon (Si:C). This Si:C layer can be grown in the same chamber used for other epitaxy steps or in a dedicated Si:C epitaxy chamber. The Si:C can include carbon in the range of about 0.2 percent to about 3.0 percent.

In some embodiments of the present invention, the source/drain region 1001 is an n-doped region over the nFET semiconductor fin 101. The source/drain region 1001 can be doped by a variety of methods, for example, in-situ doped epitaxy, doped following the epitaxy, or by implantation and plasma doping. In some embodiments of the invention, the n-type doping concentration can range from $1\times10^{19}$ $cm^{-3}$ to $5\times10^{21}$ $cm^{-3}$, or between $1\times10^{20}$ $cm^{-3}$ and $5\times10^{21}$ $cm^{-3}$. The depth of the n-type dopant (e.g., As, P, Sb) ion implantation is controlled by adjusting the implantation energy.

In some embodiments of the present invention, the source/drain region 1003 is a p-doped region over the pFET semiconductor fin 102. The source/drain regions 1003 can be doped by a variety of methods, for example, in-situ doped epitaxy, doped following the epitaxy, or by implantation and plasma doping. In some embodiments of the invention, the p-type doping concentration can range from $1\times10^{19}$ $cm^{-3}$ to $5\times10^{21}$ $cm^{-3}$, or between $1\times10^{20}$ $cm^{-3}$ and $5\times10^{21}$ $cm^{-3}$. The depth of the p-type dopant (e.g., B, $BF_2$, Al, Ga) ion implantation is controlled by adjusting the implantation energy.

The cap layers 1002 and 1004 are opposite a surface of the source/drain regions 1001 and 1003. The cap layers 1002 and 1004 can be formed using any suitable deposition processes, for example, CVD, PECVD, ALD, evaporation, PVD, chemical solution deposition, or other like processes. In some embodiments of the invention, the Cap layers 1002 and 1004 are a silicon nitride, silicon carbonitride, or metal oxide.

Figure 11:
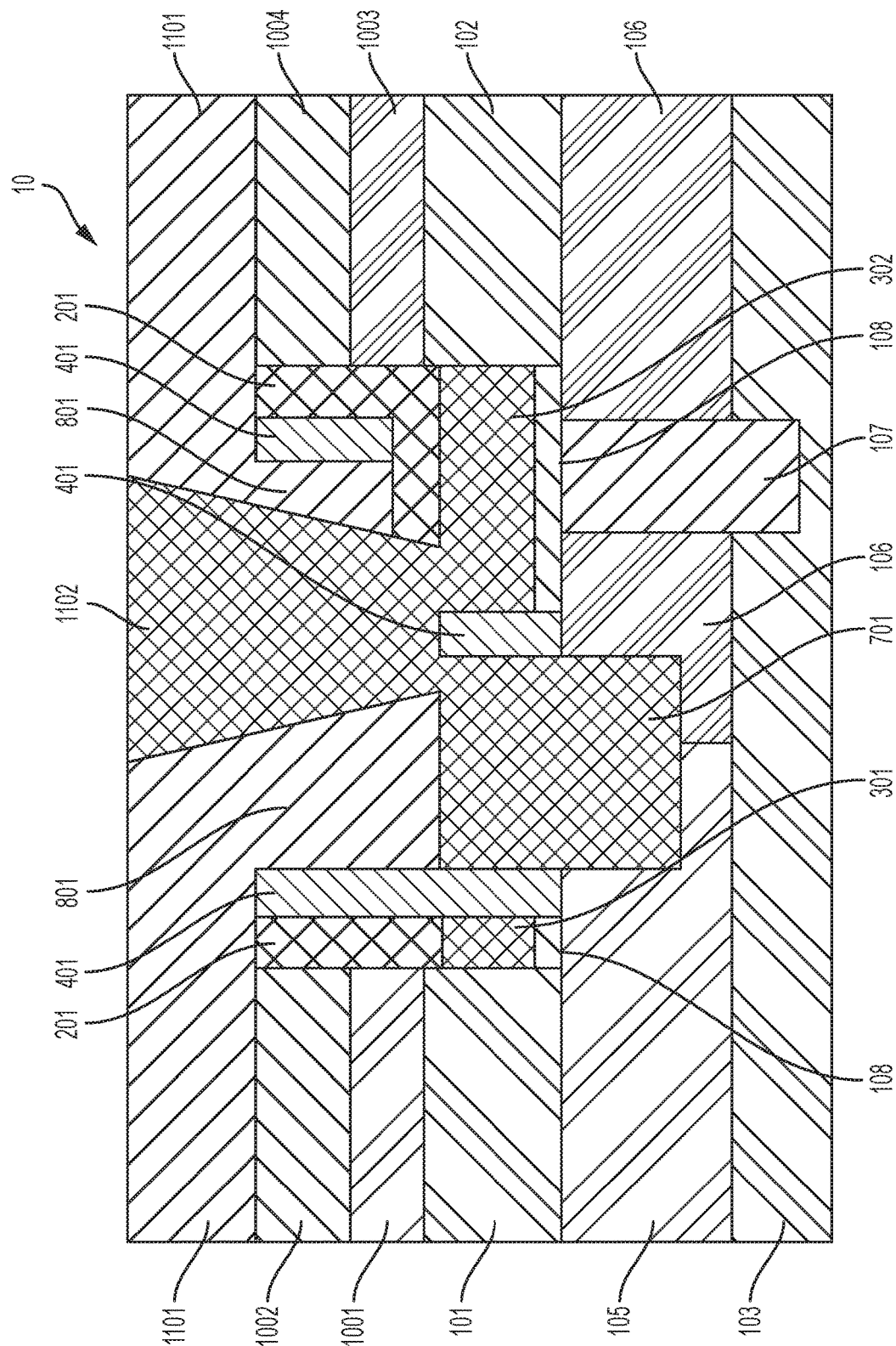
FIG. 11 depicts a semiconductor device after a fabrication operation according to embodiments of the invention.

FIG. 11 depicts a cross-sectional view of the structure 10 after a fabrication operation in which a dielectric layer 1101 is formed opposite a surface of the dielectric layer 801, the cap layers 1002 and 1004, the first spacers 201, and the second spacers 401. The dielectric layer 1101 can be formed using any known process. In some embodiments of the invention, the dielectric layer 1101 is deposited using a CVD, PECVD, ALD, PVD, chemical solution deposition, or other like process in combination with a wet or dry etch process. The dielectric layer 1101 can be made of any suitable material, for example, a low-k dielectric, a nitride, silicon nitride, silicon dioxide, SiON, SiOCN, or SiBCN. As shown in FIG. 11, the dielectric layer 1101 can include a same material as the dielectric layer 801.

Portions of the dielectric layer 1101 and the dielectric layer 801 are removed to form a trench, which is filled a contact material to form a conductive contact 1102. The conductive contact 1102 includes a surface that contacts the buried contact 701, the pFET gate 302, and centermost second spacers 401 between the buried contact 701 and the pFET gate 302. An additional surface of the conductive contact contacts the rightmost first spacer 201.

The conductive contact 1102 can be made of any suitable conducting material, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. In some embodiments of the invention, the conductive contact 1102 includes a same material as at least one of the contact material 601 and the gate material 109, and accordingly, a same material as the nFET gate 301 and the pFET gate 302.

The conductive contact 1102 can be formed or deposited using known metallization techniques. In some embodiments of the invention, the contact material is overfilled, forming an overburden above a surface of the dielectric layer 1101. In some embodiments of the invention, a CMP selective to the dielectric layer 1101 removes the overburden.

First spacer 201 and second spacer 401 enable application of a SAC process for forming buried contact 701 between the nFET gate 301 and the pFET gate 302. The buried contact 701 contacts the nFET active region 105 and the pFET active region 106. A conductive contact 1102 contacts the pFET gate 302 and the buried contact 701.

The second spacer 401 prevents the buried contact 701 from electrically shorting to the nFET gate 301 and a thickness of the second spacer 401 provides a minimal separation between the buried contact 701 and the nFET gate 301, for example, of about 5 nanometers to about 12 nanometers. Stated otherwise, a minimum required buried contact 701 to nFET gate 301 spacing is defined by a thickness of the second spacer 401.

Thus it can be seen from the foregoing detailed description that technical effects and benefits of the invention facilitate scaling to sub-10 nm VFET-based SRAM devices. Scaling to sub-10 nm in VFET-based SRAM devices is bottlenecked in conventional methods and devices by the feature-to-feature spacing requirements, which cannot be reduced below a certain level because certain tolerances must be maintained in order to compensate for overlay errors that result from the use of lithography-based processes to form certain features. Embodiments of the invention address the above-described shortcomings of known VFET fabrication processes by providing technical effects and benefits that include fabrication methods and resulting structures based on novel self-alignment fabrication operations that reduce the reliance on lithography-based fabrication processes, thereby enabling reductions in feature-to-feature spacing requirements and enabling an ultimate reduction in the footprint of the VFET. In some embodiments of the invention, the feature-to-feature spacing requirement is a contact-to-gate spacing requirement, and the VFET is fabricated using a SAC process to form a buried contact. Because the SAC process does not rely on lithography-based fabrication processes, there is no need to include in contact-to-gate spacing requirements sufficient tolerance to compensate for overlay errors inherent in lithography-based fabrication processes.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrases "etch selectivity relative to" and "selective to," such as, for example, "a first element has an etch selectivity relative to a second element" and "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

As previously noted herein, for the sake of brevity, conventional techniques related to semiconductor device and IC fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include PVD, CVD, electrochemical deposition (ECD), MBE and more recently, ALD among others. Removal/etching is any process that removes material from the wafer. Examples include etch processes (either wet or dry), CMP, and the like. RIE, for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A semiconductor device comprising:
   a first semiconductor fin formed opposite a surface of a first active region of a substrate, the first active region comprising a first dopant type;
   a second semiconductor fin formed opposite a surface of a second active region of the substrate, the second active region comprising a second dopant type complementary to the first dopant type;
   a first gate formed over the first active region of the substrate, the first gate on a sidewall of the first semiconductor fin;

a second gate formed over the second active region of the substrate, the second gate on a sidewall of the second semiconductor fin;

a self-aligned buried contact formed over recessed portions of the first active region and the second active region and between the first semiconductor fin and the second semiconductor fin;

a dielectric layer formed over portions of the self-aligned buried contact, the dielectric layer comprising a first dielectric material formed on the first gate;

a spacer between the first gate and the self-aligned buried contact, wherein a spacer material included in the spacer has an etch selectivity relative to the first dielectric material; and a contact formed in the dielectric layer, the contact positioned in direct contact with a topmost surface of the self-aligned buried contact and a topmost surface of the first gate.

2. The semiconductor device of claim 1, wherein the spacer has a thickness of about 5 nanometers to about 12 nanometers.

3. The semiconductor device of claim 1, wherein the spacer is formed on a sidewall of the dielectric layer comprising the first dielectric material and a sidewall of the first gate.

4. A semiconductor device comprising:

a substrate comprising a first active region and a second active region, the first active region comprising a first dopant type and the second active region comprising a second dopant type complementary to the first dopant type;

a first gate formed opposite a surface of the first active region;

a second gate formed opposite a surface of the second active region;

a buried contact formed over recessed portions of the first active region and the second active region;

a dielectric layer formed over portions of the buried contact, the dielectric layer comprising a first dielectric material formed on the first gate;

a dielectric spacer formed on the first active region and between the buried contact and the first gate, the dielectric spacer comprising a second dielectric material having an etch selectivity relative to the first dielectric material; and a contact formed in the dielectric layer, the contact positioned on a topmost surface of the buried contact and on a topmost surface of the first gate.

5. The semiconductor device of claim 4, wherein the dielectric spacer has a thickness of about 5 nanometers to about 12 nanometers.

6. The semiconductor device of claim 4, wherein the dielectric spacer is formed on a sidewall of the dielectric layer comprising the first dielectric material and a sidewall of the first gate.

* * * * *